(12) United States Patent  
Chen et al.

(10) Patent No.: US 8,502,349 B2  
(45) Date of Patent: Aug. 6, 2013

(54) PN-JUNCTION VARACTOR IN A BICMOS PROCESS AND MANUFACTURING METHOD OF THE SAME

(75) Inventors: Fan Chen, Shanghai (CN); Xiongbin Chen, Shanghai (CN)

(73) Assignee: Shanghai Hua Hong Nec Electronics Co., Ltd., Shanghai (CN)

( * ) Notice: Subject to any disclaimer, the term of this patent is extended or adjusted under 35 U.S.C. 154(b) by 48 days.

(21) Appl. No.: 13/315,116

(22) Filed: Dec. 8, 2011

(65) Prior Publication Data

US 2012/0146188 A1    Jun. 14, 2012

(30) Foreign Application Priority Data

Dec. 13, 2010  (CN) .......................... 2010 1 0585008

(51) Int. Cl.
  *H01L 29/93*  (2006.01)
(52) U.S. Cl.
  USPC ........................................................ 257/596

(58) Field of Classification Search
  USPC .................. 257/596, E29.344, E21.364, 110,
    257/279, 458, 461–464, 470, 490, 494–495,
    257/509, 525, 544–550, 656, 927, 929, E27.015,
    257/E27.017, E27.03–E27.032, E27.109,
    257/E29.194–E29.225, E27.049; 438/202–208,
    438/234–239, 912, 379
  See application file for complete search history.

(56) References Cited

U.S. PATENT DOCUMENTS 6,724,066 B2 *   4/2004   Swanson et al. ............... 257/557
7,495,312 B2 *   2/2009   Algotsson et al. ............. 257/566

* cited by examiner

*Primary Examiner* — Dao H Nguyen
*Assistant Examiner* — Tram H Nguyen
(74) *Attorney, Agent, or Firm* — Blakely Sokoloff Taylor & Zafman

(57) ABSTRACT

A PN-junction varactor in a BiCMOS process is disclosed which comprises an N-type region, a P-type region and N-type pseudo buried layers. Both of the N-type and P-type regions are formed in an active area and contact with each other, forming a PN-junction; the P-type region is situated on top of the N-type region. The N-type pseudo buried layers are formed at bottom of shallow trench field oxide regions on both sides of the active area and contact with the N-type region; deep hole contacts are formed on top of the N-type pseudo buried layers in the shallow trench field oxide regions to pick up the N-type region. A manufacturing method of PN-junction varactor in a BiCMOS process is also disclosed.

6 Claims, 2 Drawing Sheets

PN-JUNCTION VARACTOR IN A BICMOS PROCESS AND MANUFACTURING METHOD OF THE SAME

CROSS-REFERENCES TO RELATED APPLICATIONS

This application claims the priority of Chinese patent application number 1010585008.0, filed on Dec. 13, 2010, the entire contents of which are incorporated herein by reference.

TECHNICAL FIELD

The present invention relates to the field of semiconductor integrated circuit manufacturing, and in particular, relates to a PN-junction varactor in a BiCMOS process. The present invention also relates to a manufacturing method of PN-junction varactor in a BiCMOS process.

BACKGROUND OF THE INVENTION

For a PN-junction varactor in a current BiCMOS process, an N-terminal, i.e. an N-type region of the PN-junction, is generally picked up through a buried layer or a well situated at the bottom of a shallow trench field oxide region, namely a shallow trench isolation (STI), and an active area connected to the buried layer or the well. This method is determined by the vertical structure of the existing PN-junction varactor. The existing PN-junction varactor has disadvantages such as a large device area and a large contact resistance. Moreover, as an additional active area must be arranged to pick up the N-terminal, and must be isolated from a P-terminal by STIs or other field oxide regions, further reduction of the device size is greatly limited.

SUMMARY OF THE INVENTION

An objective of the present invention is to provide a PN-junction varactor in a BiCMOS process, which can achieve a great reduction in device area and conduction resistance, as well as maintain a good device performance, and thus can be used as an output device for high-frequency BiCMOS circuits. Another objective of the present invention is to provide a manufacturing method of PN-junction varactor in a BiCMOS process.

To achieve the above objectives, the present invention provides a PN-junction varactor in a BiCMOS process formed on a P-type silicon substrate, wherein an active area is isolated by shallow trench field oxide regions. The PN-junction varactor comprises:

An N-type region, comprising an N-type ion implantation region formed in the active area; a depth of the N-type region is larger than those of bottoms of the shallow trench field oxide regions; a bottom of the N-type region laterally extends into the bottoms of the shallow trench field oxide regions on both sides of the active area. The N-type region is formed by performing N-type ion implantation with the following process conditions: impurities implanted are phosphorus and/or arsenic, implantation dose is $1e12$ $cm^{-2}$~$5e14$ $cm^{-2}$ and implantation energy is 50 KeV~400 KeV.

N-type pseudo buried layers, formed at bottom of the shallow trench field oxide regions on both sides of the active area and contacting with laterally extension parts of the N-type region; deep hole contacts are formed on top of the N-type pseudo buried layers in the shallow trench field oxide regions to pick up the N-type region. The N-type pseudo buried layers are formed by performing N-type ion implantation to the bottom of shallow trenches prior to the formation of the shallow trench field oxide regions; the N-type ion implantation performed to form the N-type pseudo buried layers has the following process conditions: impurities implanted are phosphorus and/or arsenic, implantation dose is $1e14$ $cm^{-2}$~$1e16$ $cm^{-2}$ and implantation energy is 3 KeV ~50 KeV.

A P-type region, comprising a P-type ion implantation region brined in the active area; the P-type region is situated in an upper part of the N-type region, and contacts with the N-type region to form a PN-junction the P-type region is picked up through a metal contact on top of the P-type region. The deep hole contacts are in contact with the N-type pseudo buried layers, and are formed by forming a deep hole on top of each N-type pseudo buried layer through the respective shallow trench field oxide region, and then depositing a titanium/titanium nitride barrier metal layer in the deep hole and filling tungsten into the deep hole. The P-type region is formed by performing P-type ion implantation with the following process conditions: impurities implanted are boron or boron fluoride, implantation dose is $1e12$ $cm^{-2}$~$5e14$ $cm^{-2}$ and implantation energy is 5 KeV~200 KeV.

To achieve the above objectives, the present invention provides a manufacturing method of PN-junction varactor in a BiCMOS process comprises the following steps:

step 1: forming shallow trenches and an active area in a P-type silicon substrate.

step 2: forming N-type pseudo buried layers by performing N-type ion implantation to bottoms of the shallow trenches on both sides of the active area. The N-type ion implantation performed to form the N-type pseudo buried layers has the following process conditions: impurities implanted are phosphorus and/or arsenic, implantation dose is $1e14$ $cm^{-2}$~$1e16$ $cm^{-2}$ and implantation energy is 3 KeV~50 KeV.

step 3: forming shallow trench field oxide regions by tilling silicon oxide into the shallow trenches.

step 4: forming an N-type region by performing N-type ion implantation to the active area; the depth of the N-type region is larger than those of bottoms of the shallow trench field oxide regions; the bottom of the N-type region laterally extends into the bottoms of the shallow trench field oxide regions on both sides of the active area and contacts with the N-type pseudo buried layers. The N-type ion implantation performed to form the N-type region has the following process conditions: impurities implanted are phosphorus and/or arsenic, implantation dose is $1e12$ $cm^{-2}$~$5e14$ $cm^{-2}$ and implantation energy is 50 KeV~400 KeV.

step 5: forming a P-type region by performing P-type ion implantation to the active area; the P-type region is situated in an upper part of the N-type region and contacts with the N-type region to form a PN-junction. The P-type ion implantation performed to form the P-type region has the following process conditions: impurities implanted are boron or boron fluoride, implantation dose is $1e12$ $cm^{-2}$~$5e14$ $cm^{-2}$ and implantation energy is 5 KeV~200 KeV.

step 6: performing drive-in annealing to the N-type region, the P-type region and the N-type pseudo buried layers. The drive-in annealing process is a rapid drive-in annealing process with the following process conditions: temperature is 1000~1050 and time is 10 s~30 s.

step 7: forming deep hole contacts on top of the N-type pseudo buried layers in the shallow trench field oxide regions to pick up the N-type region; forming a metal contact on top of the P-type region to pick up the P-type region. The deep hole contacts are formed by forming a deep hole on top of each N-type pseudo buried layer through the respective shallow trench field oxide region, and then depositing a titanium/titanium nitride barrier metal layer in the deep hole and filling tungsten into the deep hole.

The present invention uses N-type pseudo buried layers as connection layers for the N-terminal, i.e. the N-type region of the PN-junction, and adopts deep hole contacts to pick up the N-type region, which can greatly reduce the device area and the conduction resistance of a device, and meanwhile maintain a good device performance. The device provided by the present invention can be used as an output device for high-frequency BiCMOS circuits.

BRIEF DESCRIPTION OF THE DRAWINGS

The present invention will be further described and specified by using figures and implementation details as follows.

DETAILED DESCRIPTION OF THE INVENTION

Figure 1:
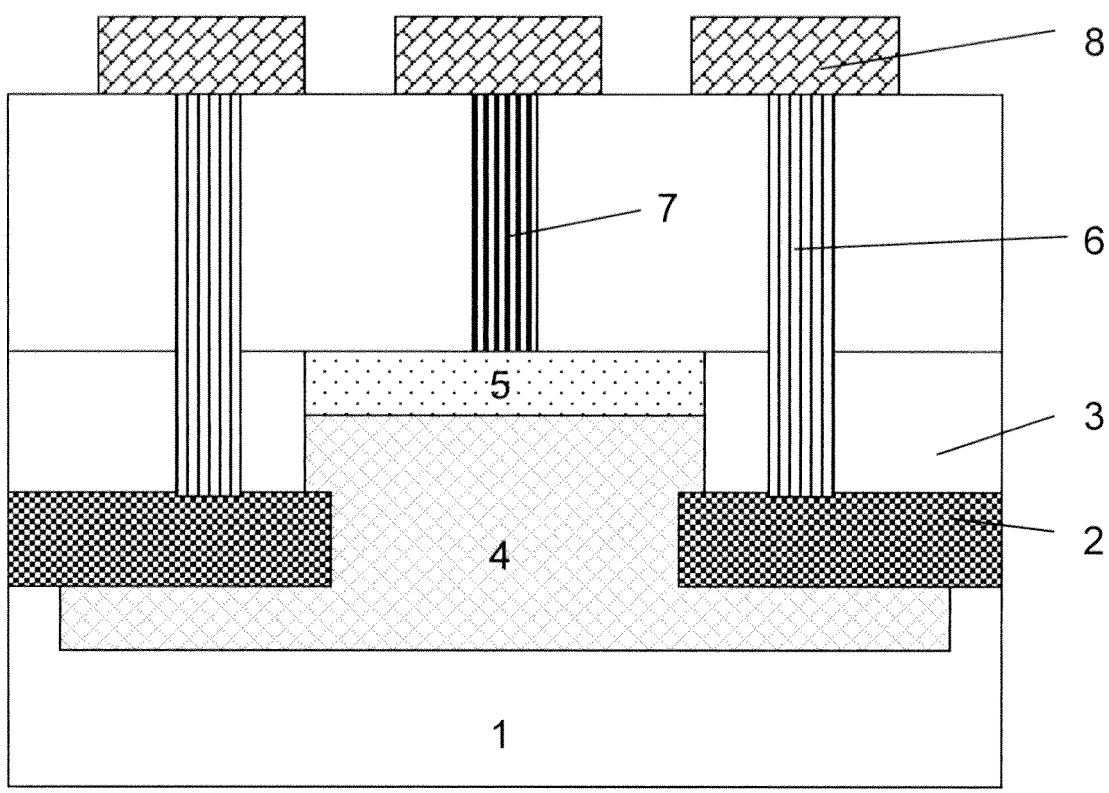
FIG. 1 shows the structure of a PN-junction varactor in a BiCMOS process according to an embodiment of the present invention.

FIG. 1 shows the structure of a PN-junction varactor in a BiCMOS process according to an embodiment of the present invention. The PN-junction varactor is formed on a P-type silicon substrate 1, wherein an active area is isolated by shallow trench field oxide regions 3, namely shallow trench isolations (STIs). The PN-junction varactor comprises:

An N-type region 4, i.e. an N-terminal, comprising an N-type ion implantation region formed in the active area; the depth of the N-type region 4 is larger than those of bottoms of the shallow trench field oxide regions 3; the bottom of the N-type region 4 laterally extends into the bottoms of the shallow trench field oxide regions 3 on both sides of the active area. The N-type region 4 is formed by performing N-type ion implantation with the following process conditions: impurities implanted are phosphorus and/or arsenic, implantation dose is $1e12\ cm^{-2} \sim 5e14\ cm^{-2}$ and implantation energy is 50 KeV~400 KeV.

N-type pseudo buried layers 2, formed at bottom of the shallow trench field oxide regions 3 on both sides of the active area and contacting with laterally extension parts of the N-type region 4; deep hole contacts 6 are formed on top of the N-type pseudo buried layers 2 in the shallow trench field oxide regions 3 to pick up the N-type region 4. The N-type pseudo buried layers 2 are formed by performing N-type ion implantation to the bottom of shallow trenches prior to the formation of the shallow trench field oxide regions 3; the N-type ion implantation performed to form the N-type pseudo buried layers 3 has the following process conditions: impurities implanted are phosphorus and/or arsenic, implantation dose is $1e14\ cm^{-2} \sim 1e16\ cm^{-2}$ and implantation energy is 3 KeV~50 KeV.

A P-type region 5, comprising a P-type ion implantation region formed in the active area; the P-type region 5 is situated in an upper part of the N-type region 4, and contacts with the N-type region 4 to form a PN-junction; the P-type region 5 is picked up through a metal contact 7 on top of the P-type region 5. The deep hole contacts 6 are in contact with the N-type pseudo buried layers 2, and are formed by forming a deep hole on top of each N-type pseudo buried layer 2 through the respective shallow trench field oxide region 3, and then depositing a titanium/titanium nitride barrier metal layer in the deep hole and filling tungsten into the deep hole.

Figure 2:
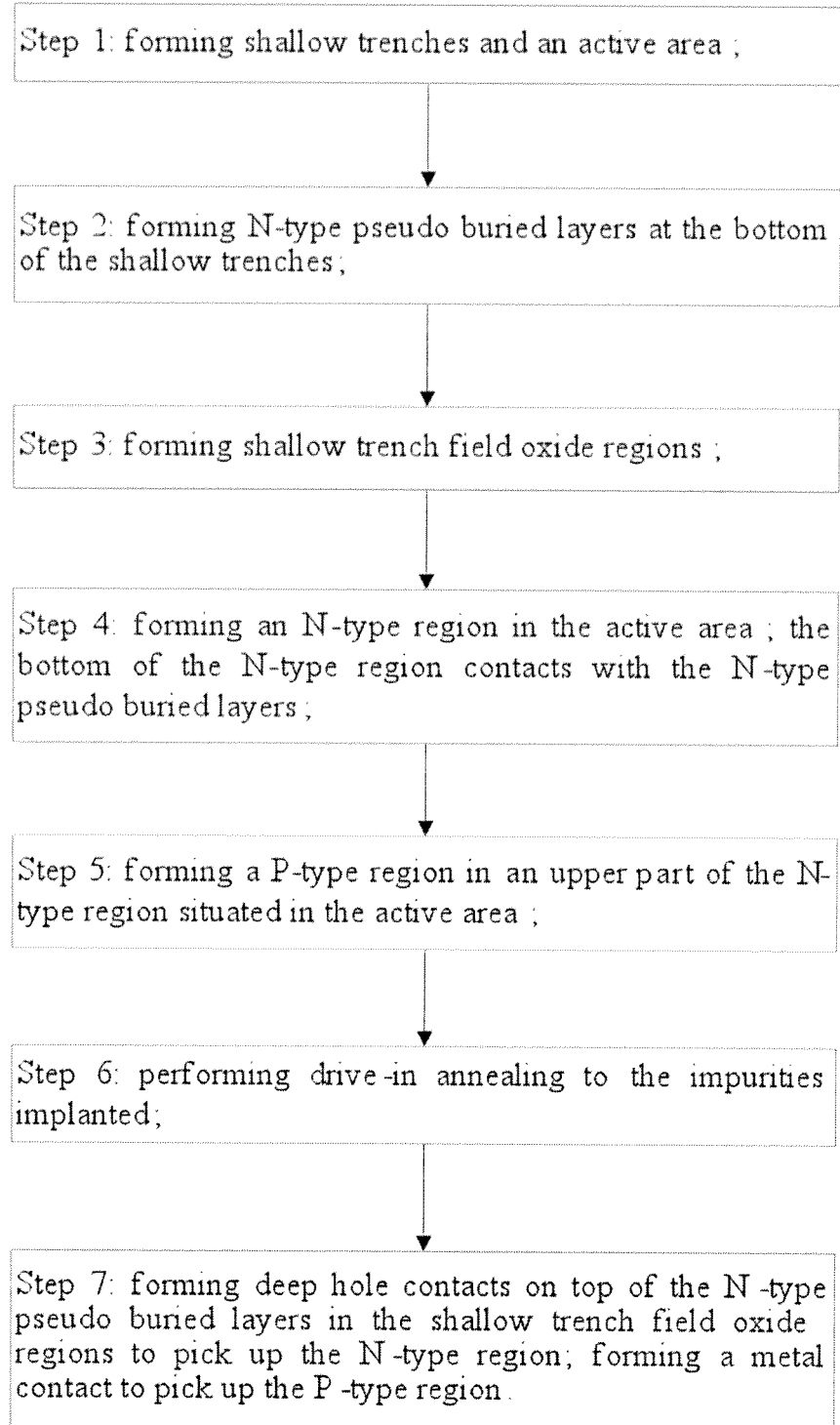
FIG. 2 is a flow chart showing the manufacturing method of PN-junction varactor in a BiCMOS process according to an embodiment of the present invention.

FIG. 2 is a flow chart showing the manufacturing method of PN-junction varactor in a BiCMOS process according to an embodiment of the present invention, which will be further specified as follows by referring to both of FIG. 1 and FIG. 2. The method according to an embodiment of the present invention comprises the following steps:

step 1: forming shallow trenches and an active area in a P-type silicon substrate 1.

step 2: forming N-type pseudo buried layers 2 by performing N-type ion implantation to bottoms of the shallow trenches on both sides of the active area. The N-type ion implantation performed to form the N-type pseudo buried layers 2 has the following process conditions: impurities implanted are phosphorus and/or arsenic, implantation dose is $1e14\ cm^{-2} \sim 1e16\ cm^{-2}$ and implantation energy is 3 KeV~50 KeV.

step 3: forming shallow trench field oxide regions 3, namely STIs, by filling silicon oxide into the shallow trenches.

step 4: forming an N-type region 4 by performing N-type ion implantation to the active area; the depth of the N-type region 4 is larger than those of bottoms of the shallow trench field oxide regions 3; the bottom of the N-type region 4 laterally extends into the bottoms of the shallow trench field oxide regions 3 on both sides of the active area and contacts with the N-type pseudo buried layers 2. The N-type ion implantation performed to form the N-type region 4 has the following process conditions: impurities implanted are phosphorus and/or arsenic, implantation dose is $1e12\ cm^{-2} \sim 5e14\ cm^{-2}$ and implantation energy is 50 KeV~400 KeV.

step 5: forming a P-type region 5 by performing P-type ion implantation to the active area; the P-type region 5 is situated in an upper part of the N-type region 4 and contacts with the N-type region 4 to form a PN-junction. The P-type ion implantation performed to form the P-type region 5 has the following process conditions: impurities implanted are boron or boron fluoride, implantation dose is $1e12\ cm^{-2} \sim 5e14\ cm^{-2}$ and implantation energy is 5 KeV~200 KeV.

step 6: performing drive-in annealing to the N-type region 4, the P-type region and the N-type pseudo buried layers 2. The drive-in annealing process is a rapid drive-in annealing process with the following process conditions: temperature is 1000~1050 and time is 10 s~30 s.

step 7: forming deep hole contacts 6 on top of the N-type pseudo buried layers 2 in the shallow trench field oxide regions 3 to pick up the N-type region 4; forming a metal contact 7 on top of the P-type region 5 to pick up the P-type region 5. The deep hole contacts 6 are formed by forming a deep hole on top of each N-type pseudo buried layer 2 through the respective shallow trench field oxide region 3, and then depositing a titanium/titanium nitride barrier metal layer in the deep hole and tilling tungsten into the deep hole. Finally, components are interconnected in the device by forming metal wires 8.

While the present invention has been particularly shown and described with reference to the above embodiments thereof, it will be understood by those skilled in the art that various changes in form and details may be made without departing from the spirit and scope of the invention.

What is claimed is:
1. A manufacturing method of PN-junction varactor in a BiCMOS process, the method comprising the following steps:
   step 1: forming shallow trenches and an active area in a P-type silicon substrate;

- step 2: forming N-type pseudo buried layers by performing N-type ion implantation to bottoms of the shallow trenches on both sides of the active area;
- step 3: forming shallow trench field oxide regions by filling silicon oxide into the shallow trenches;
- step 4: forming an N-type region by performing N-type ion implantation to the active area; the depth of the N-type region is larger than those of bottoms of the shallow trench field oxide regions; the bottom of the N-type region laterally extends into the bottoms of the shallow trench field oxide regions on both sides of the active area and contacts with the N-type pseudo buried layers;
- step 5: forming a P-type region by performing P-type ion implantation to the active area; the P-type region is situated in an upper part of the N-type region and contacts with the N-type region to form a PN-junction;
- step 6: performing drive-in annealing to the N-type region, the P-type region and the N-type pseudo buried layers;
- step 7: forming deep hole contacts on top of the N-type pseudo buried layers in the shallow trench field oxide regions to pick up the N-type region; forming a metal contact on top of the P-type region to pick up the P-type region.

2. The method according to claim 1, wherein the N-type ion implantation performed to form the N-type pseudo buried layers in step 2 has the following process conditions: impurities implanted are phosphorus and/or arsenic, implantation dose is $1e14$ $cm^{-2}$~$1e16$ $cm^{-2}$ and implantation energy is 3 KeV~50 KeV.

3. The method according to claim 1, wherein the N-type ion implantation performed to form the N-type region in step 4 has the following process conditions: impurities implanted are phosphorus and/or arsenic, implantation dose is $1e12$ $cm^{-2}$~$5e14$ $cm^{-2}$ and implantation energy is 50 KeV~400 KeV.

4. The method according to claim 1, wherein the P-type ion implantation performed to form the P-type region in step 5 has the following process conditions: impurities implanted are boron or boron fluoride, implantation dose is $1e12$ $cm^{-2}$~$5e14$ $cm^{-2}$ and implantation energy is 5 KeV~200 KeV.

5. The method according to claim 1, wherein the drive-in annealing process in step 6 is a rapid drive-in annealing process with the following process conditions: temperature is 1000° C.~1050° C. and time is 10 s~30 s.

6. The method according to claim 1, wherein the deep hole contacts are formed by forming a deep hole on top of each N-type pseudo buried layer through the respective shallow trench field oxide region, and then depositing a titanium/titanium nitride barrier metal layer in the deep hole and filling tungsten into the deep hole.

* * * * *